US009178066B2

(12) United States Patent
Chiang et al.

(10) Patent No.: US 9,178,066 B2
(45) Date of Patent: Nov. 3, 2015

(54) METHODS FOR FORMING A SEMICONDUCTOR ARRANGEMENT WITH STRUCTURES HAVING DIFFERENT HEIGHTS

(71) Applicant: Taiwan Semiconductor Manufacturing Company Limited, Hsin-Chu (TW)

(72) Inventors: Tsung-Yu Chiang, New Taipei (TW); Chen Kuang-Hsin, Jung-Li (TW); Bor-Zen Tien, Hsinchu (TW); Tzong-Sheng Chang, Chubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/014,479

(22) Filed: Aug. 30, 2013

(65) Prior Publication Data
US 2015/0061016 A1 Mar. 5, 2015

(51) Int. Cl.
*H01L 23/544* (2006.01)
*H01L 29/78* (2006.01)
*H01L 29/66* (2006.01)
*H01L 21/311* (2006.01)
*H01L 21/3213* (2006.01)
*G03F 7/20* (2006.01)

(52) U.S. Cl.
CPC .......... *H01L 29/785* (2013.01); *G03F 7/70633* (2013.01); *H01L 21/31144* (2013.01); *H01L 21/32139* (2013.01); *H01L 23/544* (2013.01); *H01L 29/66795* (2013.01); *H01L 2223/54426* (2013.01); *H01L 2223/54453* (2013.01)

(58) Field of Classification Search
CPC ....................................................... H01L 21/70
See application file for complete search history.

(56) References Cited

U.S. PATENT DOCUMENTS

| 6,627,971 B1* | 9/2003 | Shen et al. ............... 257/538 |
| 7,381,508 B2* | 6/2008 | Kang et al. ............... 430/22 |
| 8,148,232 B2* | 4/2012 | Chen et al. ............... 438/401 |
| 2004/0087159 A1* | 5/2004 | Kim et al. ............... 438/690 |
| 2009/0179255 A1* | 7/2009 | Park ............... 257/324 |
| 2010/0155854 A1* | 6/2010 | Stahrenberg et al. ......... 257/392 |

* cited by examiner

*Primary Examiner* — Marc Armand
*Assistant Examiner* — Younes Boulghassoul
(74) *Attorney, Agent, or Firm* — Cooper Legal Group, LLC

(57) ABSTRACT

Among other things, one or more semiconductor arrangements, and techniques for forming such semiconductor arrangements are provided. A layer, such as a poly layer or an inter layer dielectric (ILD) layer, is formed over a substrate. A photoresist mask is formed over the layer. The photoresist mask comprises an open region overlaying a target region of the layer and comprises a protection region overlaying a second region of the layer. An etching process is performed through the open region to reduce a height of the layer in the target region in relation to a height of the layer in the second region because the protection region inhibits the etching process from affecting the layer in the second region. A first structure, having a first height, is formed within the target region. A second structure, having a second height greater than the first height, is formed within the second region.

20 Claims, 11 Drawing Sheets

METHODS FOR FORMING A SEMICONDUCTOR ARRANGEMENT WITH STRUCTURES HAVING DIFFERENT HEIGHTS

BACKGROUND

A semiconductor arrangement comprises one or more devices, such as FinFET transistors, formed over a substrate. In an example, the semiconductor arrangement comprises an overlay region. The overlay region comprises one or more overlay alignment marks used during semiconductor fabrication for alignment purposes. In an example, the one or more overlay alignment marks are used to align one or more masks with one or more layers during patterning, such as during lithography. An etching process is performed to expose such overlay alignment marks or to remove material from a layer of the semiconductor arrangement to form structures, such as polysilicon gate structures or inter layer dielectric (ILD) structures. Because overlay alignment marks are exposed and structures are formed by the etching process, the overlay alignment marks and the structures have similar heights, which leads to overlay alignment mark visibility issues where heights of such overlay alignment marks are constrained to heights of the structures.

DETAILED DESCRIPTION

Figure 1:
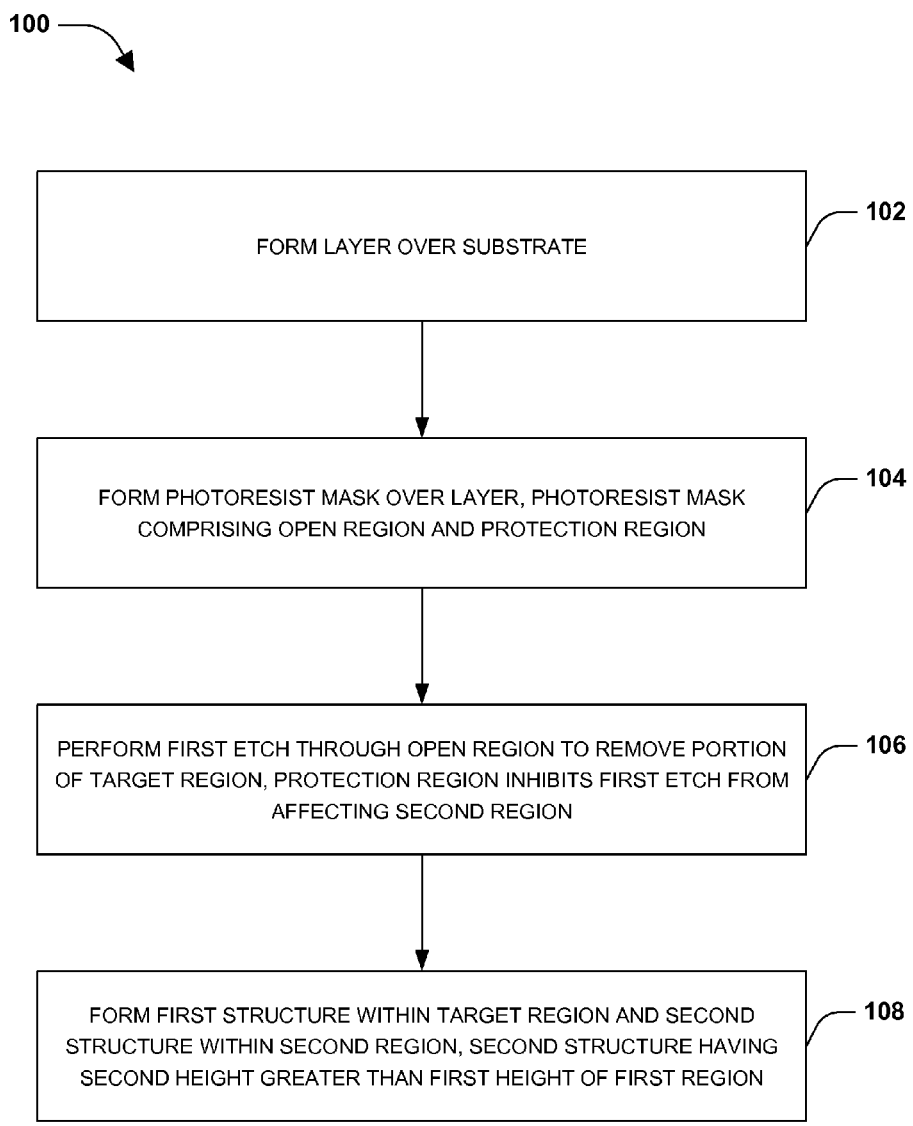
FIG. 1 is a flow diagram illustrating a method of forming a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more semiconductor arrangements, and one or more techniques for forming such semiconductor arrangements are provided herein. In an embodiment, a semiconductor arrangement comprises a layer, such as a poly layer or an inter layer dielectric (ILD) layer. A target region of the layer, such as an overlay region, and a second region of the layer, such as an active region, are defined. A photoresist mask is used during an etching process to selectively etch the target region but inhibit etching of the active region. In this way, the etched layer within the target region has a first layer height that is less than a second layer height of the layer within the active region. A first structure, such as a first poly structure or a first ILD structure, is formed from the etched layer within the target region. A second structure, such as a second poly structure or a second ILD structure, is formed from the layer within the second region. The first structure has a first height that is less than a second height of the second structure. In an embodiment, the first structure comprises a first overlay alignment mark. In an embodiment, the second structure comprises a gate structure of a FinFET transistor. In this way, the first overlay alignment mark is shorter than the gate structure, which improves overlay alignment mark visibility during fabrication, according to some embodiments.

Figure 2:
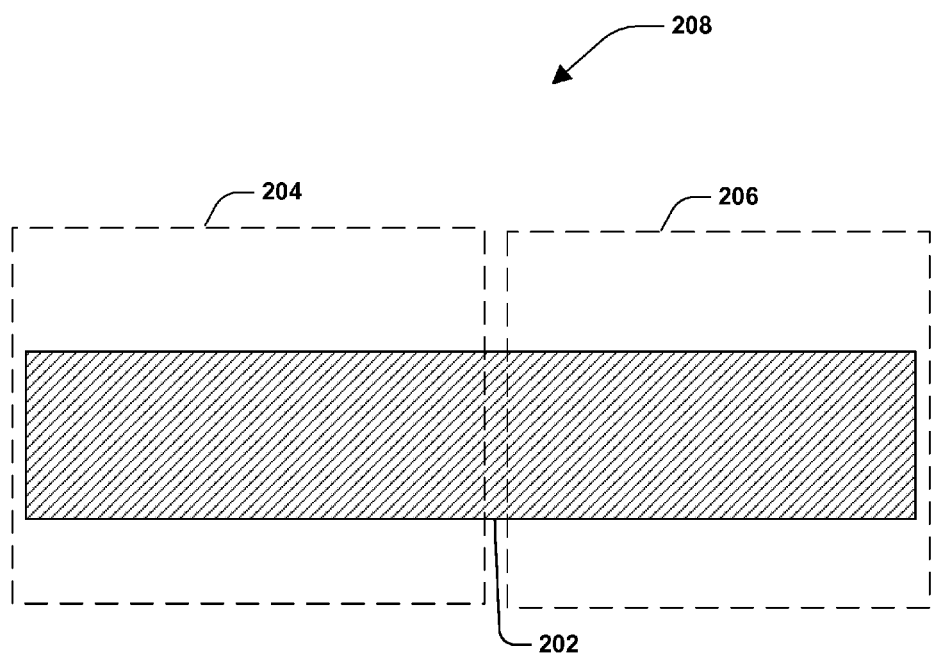
FIG. 2 is an illustration of a substrate comprising a target region and a second region, according to some embodiments.

A method 100 of forming a semiconductor arrangement is illustrated in FIG. 1, and one or more semiconductor arrangements formed by such a methodology are illustrated in FIGS. 2-11. A semiconductor arrangement 208 comprises a substrate 202, as illustrated in FIG. 2. In an embodiment of front end of line processing, the substrate 202 comprises a silicon substrate. In an embodiment of back end of line processing, the substrate 202 comprises a metal layer. The semiconductor arrangement 208 comprises a target region 204 and a second region 206. In an embodiment, the target region 204 comprises an overlay region within which one or more overlay alignment marks are to be formed for alignment purposes during semiconductor fabrication. According to some embodiments, the target region 204 corresponds to any region, such as an active region, a dummy region, etc. In an embodiment, the second region comprises an active region within which one or more gate structures, semiconductor fins, metal structures, or other active device portions are to be formed during semiconductor fabrication. According to some embodiments, the second region 206 corresponds to any region, such as a dummy region, an overlay region, etc.

Figure 3:
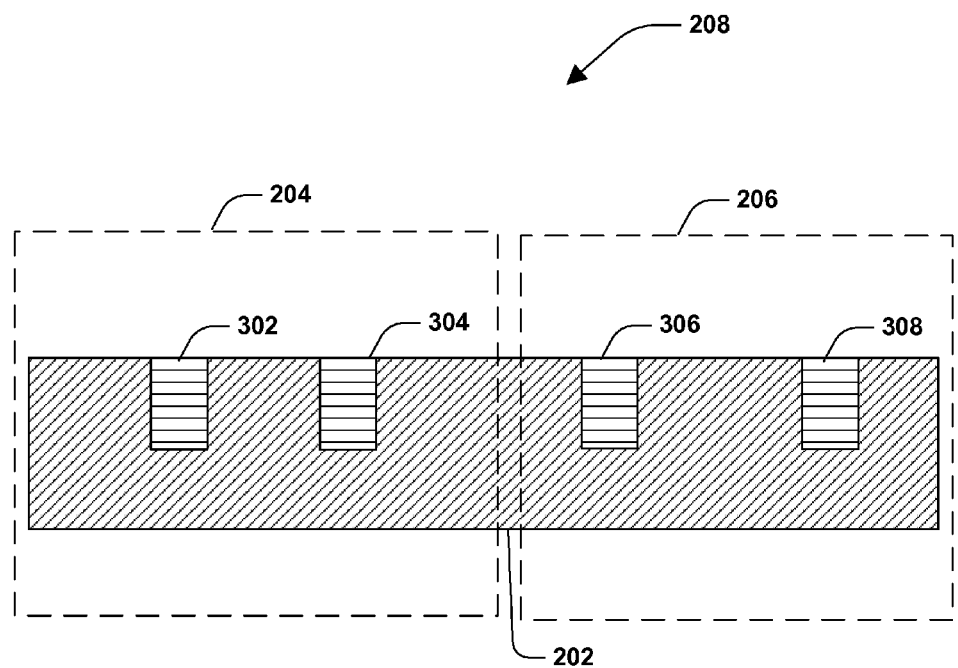
FIG. 3 is an illustration of forming one or more STI structures into a substrate, according to some embodiments.

In an embodiment, one or more STI structures are formed into the substrate 202, as illustrated in FIG. 3. In an embodiment, a first STI structure 302 and a second STI structure 304 are formed within the target region 204. In an embodiment, a third STI structure 306 and a fourth STI structure 308 are formed within the second region 206.

Figure 4:
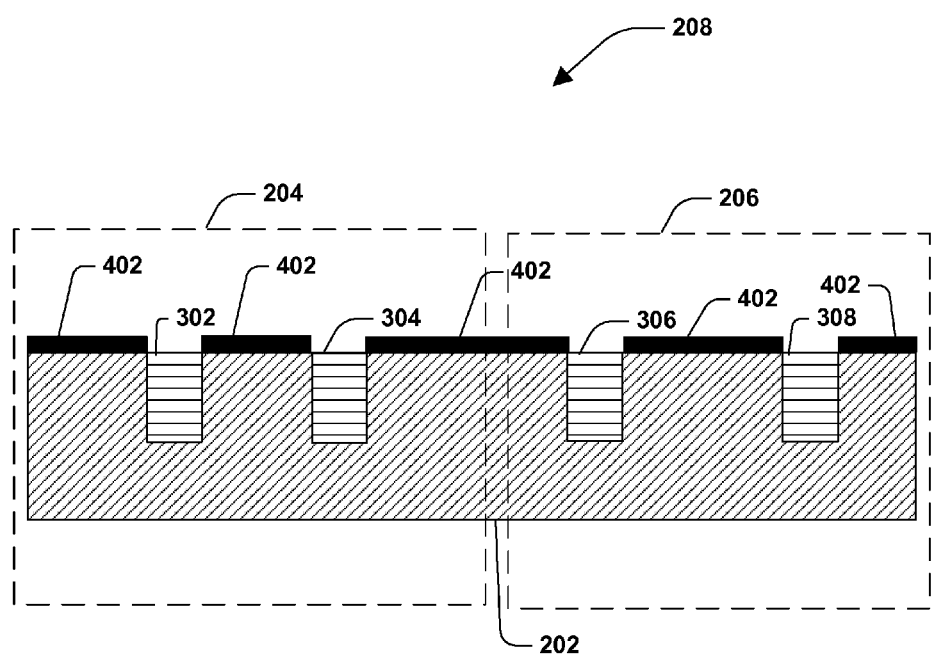
FIG. 4 is an illustration of forming a first layer over a substrate, according to some embodiments.

In an embodiment, a first layer 402 is formed over the substrate 202, as illustrated in FIG. 4. In an embodiment, the first layer 402 comprises a gate dielectric material. In an embodiment, the first layer 402 is not formed over the STI structures. In an embodiment, the first layer 402 is formed over the STI structures as well, but is subsequently removed from the STI structures such as by etching.

Figure 5:
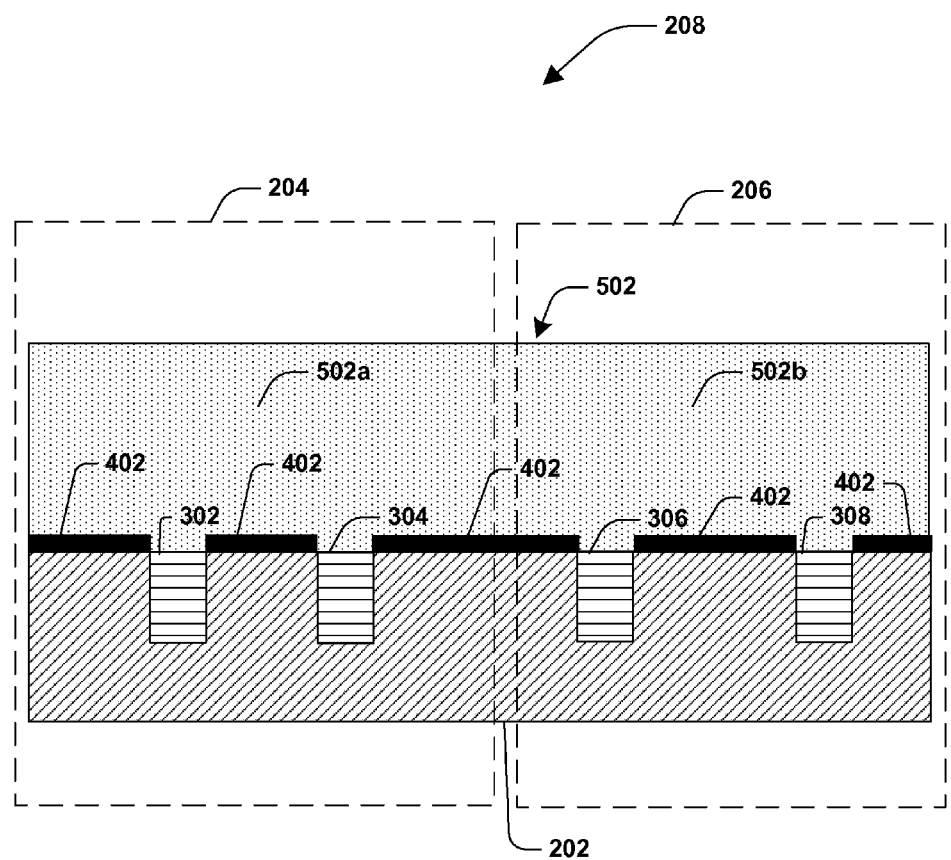
FIG. 5 is an illustration of forming a layer over a substrate, according to some embodiments.

At 102, a layer 502 is formed over the substrate 202, as illustrated in FIG. 5. In an embodiment, the layer 502 is formed over the first layer 402 and the STI structures. The layer 502 comprises a target region layer 502a formed within the target region 204. The layer 502 comprises a second region layer 502b formed within the second region 206. In an embodiment of front end of line processing, the layer 502 comprises a poly layer used to form gate structures from polysilicon. In an embodiment, the layer 502 is formed using a poly (PO) film deposition processing. In an embodiment of back end of line processing, the layer 502 comprises a metal layer used for connectivity between devices.

Figure 6:
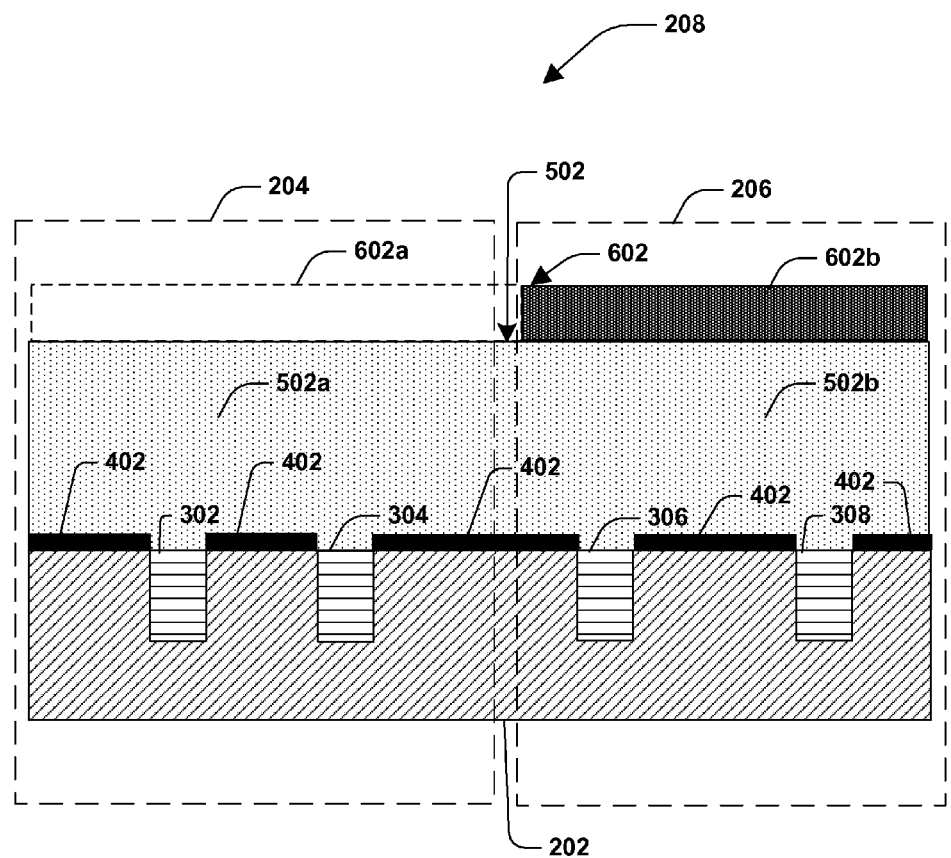
FIG. 6 is an illustration of forming a photoresist mask, according to some embodiments.

At 104, a photoresist mask 602 is formed over the layer 502, as illustrated in FIG. 6. The photoresist mask 602 comprises an open region 602a overlaying the target region layer 502a. The open region 602a allows an etching process to remove a portion of the target region layer 502a to reduce a height or thickness of the target region layer 502a to an etched height or thickness that is less than a height or thickness of the second region layer 502b. The photoresist mask 602 comprises a protection region 602b overlaying the second region layer 502b. The protection region 602b inhibits the etching processing from affecting the second region layer 502b. in an embodiment, a photoresist layer is patterned to form the photoresist mask 602, such as by removing a portion of the photoresist layer to establish the open region 602a.

Figure 7:
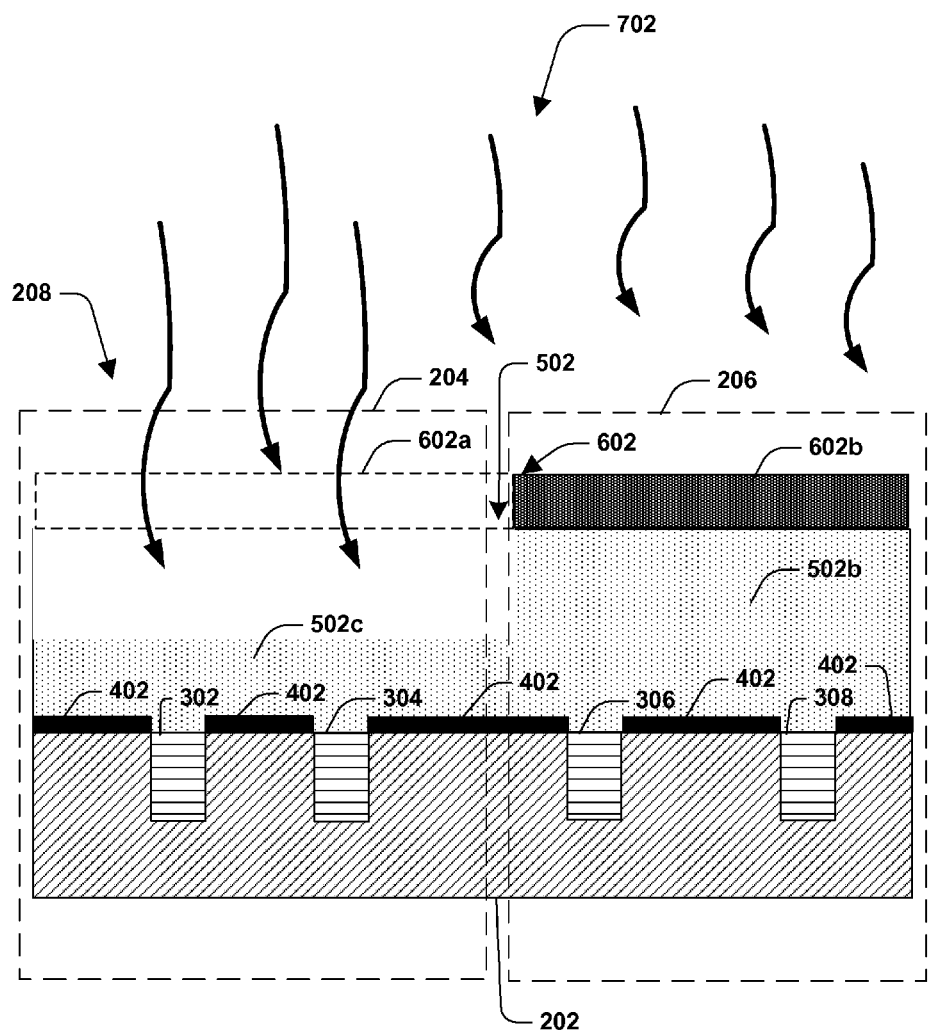
FIG. 7 is an illustration of performing a first etch, according to some embodiments.

At 106, a first etch 702 is performed through the open region 602a to remove a portion of the target region layer 502a resulting in etched target region layer 502c, as illustrated in FIG. 7. The protection region 602b inhibits the first etch 702 from affecting the second region layer 502b. The etched target region layer 502c has an etched height or thickness that is less than a height or thickness of the second region layer 502b. In an embodiment where the layer 502 comprises poly, the first etch 702 comprises a poly (PO) etch that removes the portion of the target region layer 502a resulting in the etched target region layer 502c.

Figure 8:
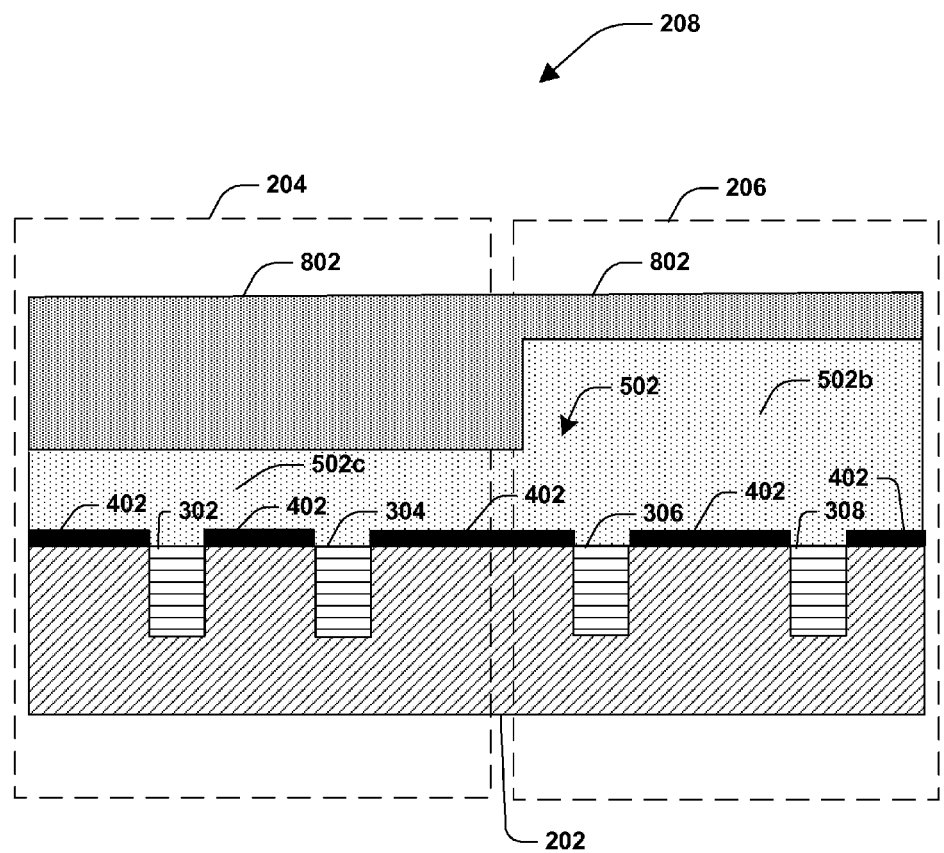
FIG. 8 is an illustration of forming a photoresist layer, according to some embodiments.
Figure 9:
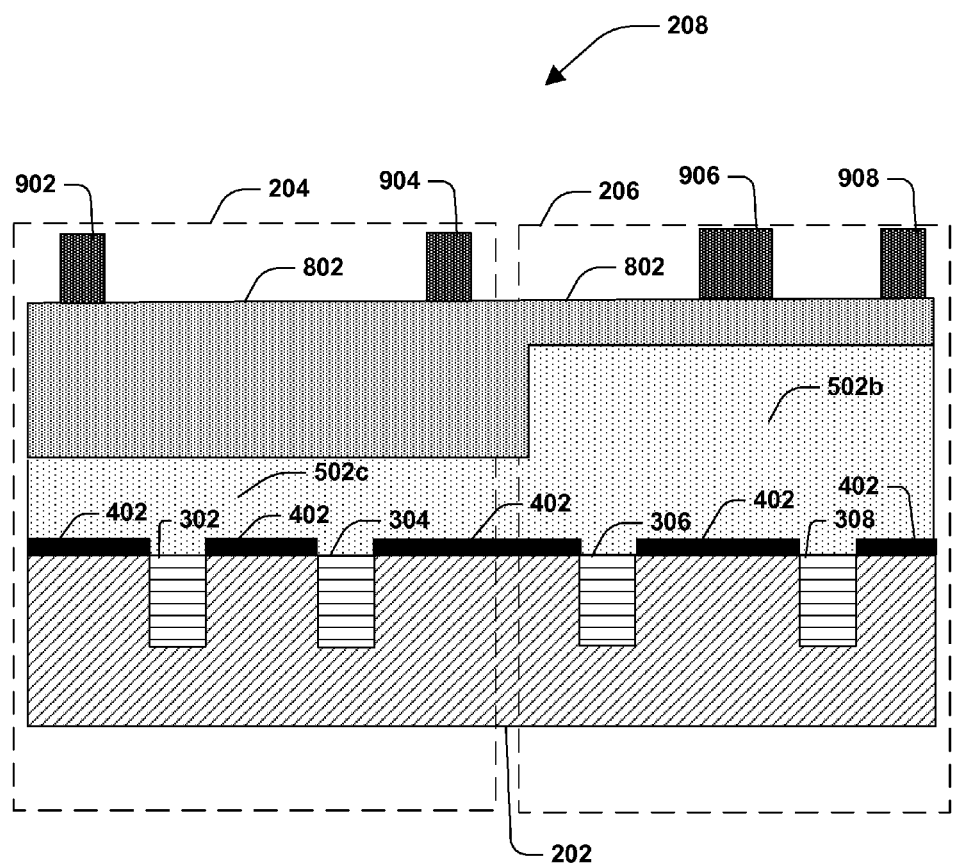
FIG. 9 is an illustration of forming a second photoresist mask, according to some embodiments.

In an embodiment, one or more photoresist layers, such as photoresist layer 802, are formed over the layer 502, as illustrated in FIG. 8. In an embodiment, a second photoresist mask is formed over the layer 502, such as over the photoresist layer 802, as illustrated in FIG. 9. In an embodiment, a photoresist layer is patterned to form the second photoresist mask. The second photoresist mask comprises one or more photoresist mask portions that are used to define structures that are to be formed from the layer 502. In an embodiment, the second photoresist mask comprises a first photoresist mask portion 902 used to define a first structure, such as an overlay alignment mark, that is to be formed from the etched target region layer 502c. The second photoresist mask comprises a second photoresist mask portion 904 used to define a second structure, such as an overlay alignment mark, that is to be formed from the etched target region layer 502c. The second photoresist mask comprises a third photoresist mask portion 906 used to define a third structure, such as a gate structure or an ILD structure, that is to be formed from the second region layer 502b. The second photoresist mask comprises a fourth photoresist mask portion 908 used to define a fourth structure, such as a gate structure or an ILD structure, that is to be formed from the second region layer 502b.

Figure 10:
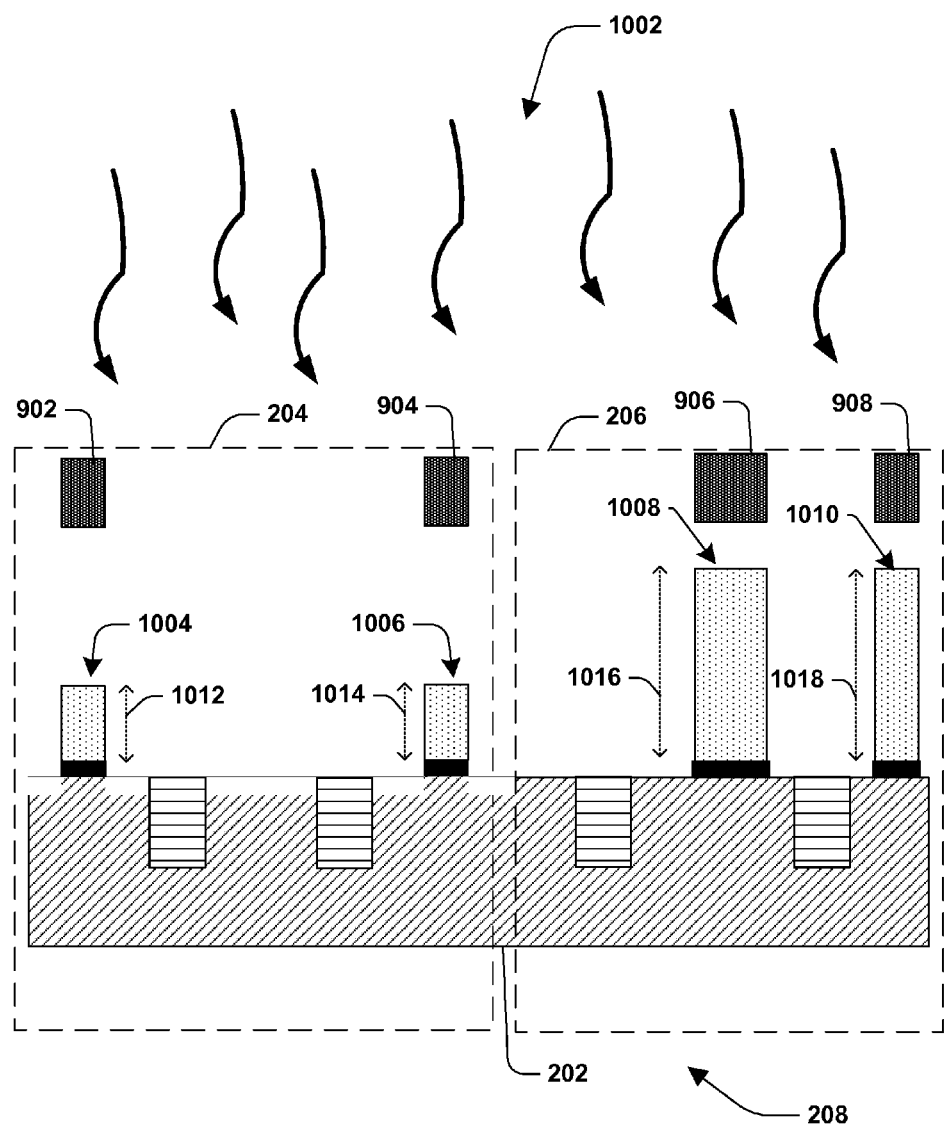
FIG. 10 is an illustration of performing a second etch, according to some embodiments.

At 108, one or more structures are formed within the target region 204 and within the second region 206, as illustrated in FIG. 10. In an embodiment, a second etch 1002 is performed to remove a portion of the etched target region layer 502c and a portion of the second region layer 502b. The first photoresist mask portion 902 inhibits the second etch 1002 from affecting a first portion of the etched target region layer 502c resulting in a first structure 1004. The second photoresist mask portion 904 inhibits the second etch 1002 from affecting a second portion of the etched target region layer 502c resulting in a second structure 1006. The third photoresist mask portion 906 inhibits the second etch 1002 from affecting a first portion of the second region layer 502b resulting in a third structure 1008. The fourth photoresist mask portion 908 inhibits the second etch 1002 from affecting a second portion of the second region layer 502b resulting in a fourth structure 1010. At least one of a first height 1012 of the first structure 1004 or a second height 1014 of the second structure 1006 are less than at least one of a third height 1016 of the third structure 1008 or a fourth height 1018 of the fourth structure 1010. In this way, one or more structures, such as overlay alignment marks, are formed within the target region 204 and have heights that are less than heights of one or more structures, such as gate structures or ILD structures, formed within the second region 206 adjacent to the target region 204. In an embodiment, the pattern of the first photoresist mask portion 902, second photoresist mask portion 904, third photoresist mask portion 906 and fourth photoresist mask portion 908, etc. of the second photoresist mask is transferred or imparted to the one or more underlaying photoresist layers, such as photoresist layer 802, such as through at least one of etching or lithographic processes. The first structure 1004, second structure 1006, third structure 1008 and fourth structure 1010, etc. are formed based upon the transferred patterns. The first structure 1004, second structure 1006, third structure 1008 and fourth structure 1010, etc. are thus formed based upon the first photoresist mask portion 902, second photoresist mask portion 904, third photoresist mask portion 906 and fourth photoresist mask portion 908, etc., albeit indirectly.

Figure 11:
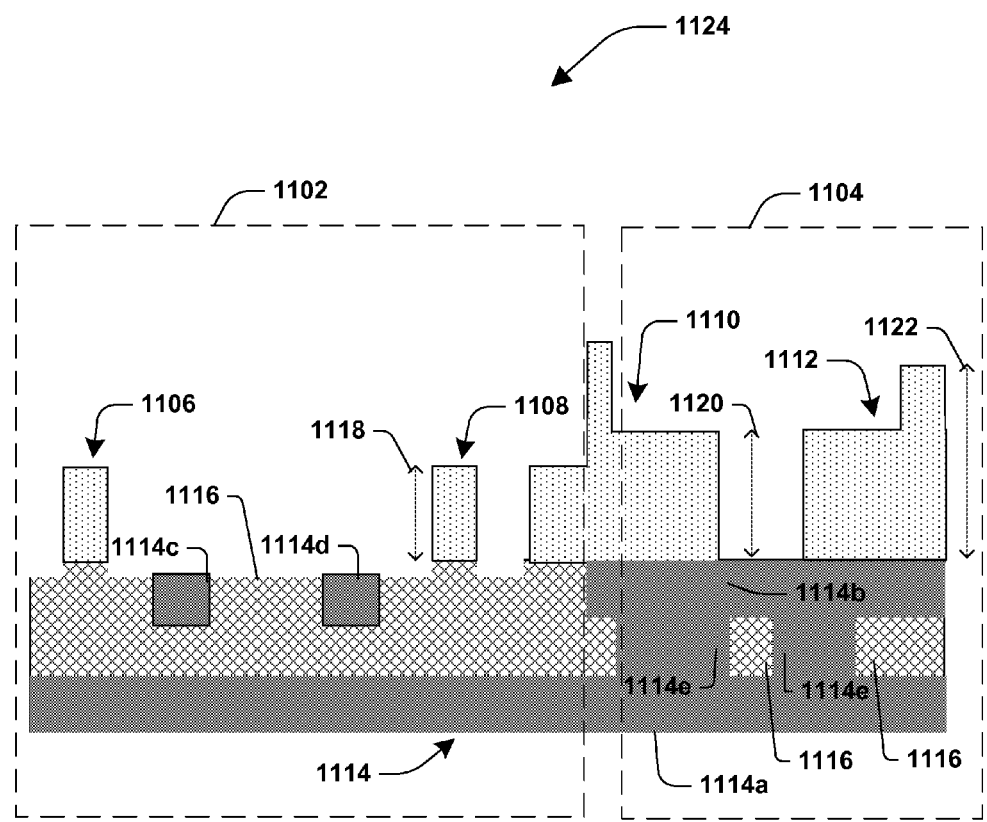
FIG. 11 is an illustration of a semiconductor arrangement, according to some embodiments.

FIG. 11 illustrates a semiconductor arrangement 1124 that, according to some embodiments, comprises one or more overlay marks having heights that are less than heights of one or more ILD structures. The semiconductor arrangement 1124 comprises an overlay region 1102 and an active region 1104. The semiconductor arrangement 1124 comprises one or more metal layers 1114. The one or more metal layers 1114 comprise one or more metal portions, such as a metal (1) layer portion 1114a, a metal (2) layer portion 1114b, a first metal portion 1114c, a second metal portion 1114d, a metal via portion 1114e connecting the metal (1) layer portion 1114a to the metal (2) layer portion 1114b, or other metal portions. The semiconductor arrangement 1124 comprises a first ILD layer 1116.

The semiconductor arrangement 1124 comprises one or more ILD structures, such as a first ILD structure 1106 and a second ILD structure 1108 formed within the overlay region 1102, and a third ILD structure 1110 and a fourth ILD structure 1112 formed within the active region 1104. The second ILD structure 1108 has a height 1118 that is less than at least one of a height 1120 of the third ILD structure 1110 or a height 1122 of the fourth ILD structure 1112. In an embodiment, the first ILD structure 1106 and the second ILD structure 1108 are formed as overlay alignment marks within the overlay region 1102, and have heights that are less than the heights of the ILD structures within the active region 1104.

In an embodiment of forming a semiconductor arrangement, a film deposition is performed to form a first layer, such as a poly layer or an ILD layer, over a substrate such as a silicon substrate or a metal layer. The first layer comprises a target region layer formed within a target region, such as an overlay region, of the semiconductor arrangement. The first layer comprises a second region layer formed within a second region, such as a device region associated with one or more FinFET devices, of the semiconductor arrangement. A bottom antireflective coating is applied to the first layer. A photoresist coating is applied over the bottom antireflective coating. A mask is formed over the photoresist coating. The mask comprises an open region overlaying the target region and a protection region overlaying the second region. A first lithography process is performed to remove a portion of the target region layer resulting in an etched target region layer having a height that is less than a height of the second region layer because the protection region of the mask inhibits the first lithography process from affecting the second region layer. A photoresist removal processing is performed to remove the photoresist coating. A second bottom antireflective coating is applied to the first layer after the first lithograph process. A second photoresist coating is applied over the second bottom antireflective coating. A second mask, defining one or more structures within the target region and one or more structures within the second region, is applied. In an embodiment a pattern is transferred from the second mask to the second photoresist coating. A second lithography process is performed to form a first structure, within the target region, from the etched target region layer. The second lithography process is performed to form a second structure, within the second region, from the second region layer. The first structure has a height that is less than a height of the second structure. Critical dimension (CD) and overlay measurements are performed with respect to the target layer, such as using the first structure as an overlay alignment mark. A film etch is performed to remove the second photoresist coating.

According to an aspect of the instant disclosure, a semiconductor arrangement is provided. The semiconductor arrangement comprises a target region. The target region comprises an overlay region. The target region comprises a first poly structure having a first height. The semiconductor arrangement comprises a second region. The second region comprises a second poly structure having a second height that is greater than the first height.

According to an aspect of the instant disclosure, a semiconductor arrangement is provided. The semiconductor arrangement comprises an overlay region. The overlay region comprises a first structure having a first height. The semiconductor arrangement comprises a second region. The second region comprises an active region. The second region comprises a second structure having a second height that is greater than the first height.

According to an aspect of the instant disclosure, a method for forming a semiconductor arrangement is provided. The method comprises forming a layer over a substrate. A photoresist mask is formed over the layer. The photoresist mask comprises an open region overlaying a target region of the layer. The photoresist mask comprises a protection region overlaying a second region of the layer. A first etch is performed through the open region to remove a portion of the target region. The protection region inhibits the first etch from affecting the second region. A first structure is formed within the target region and a second structure is formed within the second region. The second structure has a second height greater than a first height of the first structure.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor arrangement, comprising:

forming a layer over a substrate, the layer comprising a polysilicon;

forming a photoresist mask over the layer, the photoresist mask comprising an open region overlaying a target region of the layer, the photoresist mask comprising a protection region overlaying a second region of the layer;

performing a first etch through the open region to remove a portion of the target region of the layer, the protection region inhibiting the first etch from affecting the second region of the layer;

forming a first photoresist layer over the layer after the performing a first etch;

forming a second photoresist layer over the first photoresist layer;

patterning the second photoresist layer to form a second photoresist mask comprising a first photoresist mask portion and a second photoresist mask portion; and forming a first structure within the target region of the layer and a second structure within the second region of the layer, the first structure formed under the first photoresist mask portion and the second structure formed under the second photoresist mask portion, the second structure having a second height greater than a first height of the first structure.

2. The method of claim 1, the forming a photoresist mask comprising:
positioning the open region of the photoresist mask over an overlay region of the target region.

3. The method of claim 1, the forming a photoresist mask comprising:
positioning the protection region of the photoresist mask over an active region of the second region, the active region adjacent to the target region.

4. The method of claim 1, forming a first structure within the target region and a second structure within the second region comprising:
performing a second etch to remove a first portion of the target region of the layer, and to remove a second portion of the second region of the layer.

5. The method of claim 1, comprising:
forming a shallow trench isolation (STI) structures within the substrate prior to the forming a layer over the substrate.

6. The method of claim 1, the forming a first structure within the target region of the layer and a second structure within the second region of the layer comprising:
performing a second etch using the second photoresist mask to form the first structure and the second structure.

7. A method for forming a semiconductor arrangement, comprising:
forming a layer over a substrate;
forming a photoresist mask over the layer, the photoresist mask comprising an open region and a protective region;
performing a first etch whereby etchant is applied to a target region of the layer by way of the open region and is not applied to a second region of the layer due to the protective region;
forming a first photoresist layer over the layer after the performing a first etch;
forming a second photoresist layer over the first photoresist layer;
patterning the second photoresist layer to form a second photoresist mask comprising a first photoresist mask portion and a second photoresist mask portion; and
forming a first structure within the target region of the layer and forming a second structure within the second region of the layer, the second structure having a second height greater than a first height of the first structure due to the first etch, the first structure formed below the first photoresist mask portion and the second structure formed below the second photoresist mask portion.

8. The method of claim 7, comprising:
forming one or more shallow trench isolation (STI) structures within the substrate prior to the forming a layer over a substrate.

9. The method of claim 7, comprising:
forming a dielectric layer over the substrate.

10. The method of claim 9, the forming a layer over a substrate comprising:
forming the layer over the dielectric layer.

11. The method of claim 7, the layer comprising a polysilicon.

12. The method of claim 7, comprising:
forming one or more shallow trench isolation (STI) structures within the substrate; and
forming a dielectric layer over the substrate, wherein the forming a layer over a substrate comprises:
forming the layer over the one or more STI structures and over the dielectric layer.

13. The method of claim 7, the performing a first etch comprising removing less than all material within the target region of the layer.

14. The method of claim 7, the first photoresist mask portion defining an overlay alignment mark and the second photoresist mask portion defining a gate structure.

15. The method of claim 14, the first structure comprising the overlay alignment mark and the second structure comprising the gate structure.

16. The method of claim 7, the forming a first structure within the target region of the layer and forming a second structure within the second region of the layer comprising:
performing a second etch using the second photoresist mask to form the first structure and the second structure.

17. A method for forming a semiconductor arrangement, comprising:
forming one or more shallow trench isolation (STI) structures within a substrate;
forming a dielectric layer over the substrate;
forming a polysilicon layer over the one or more STI structures and the dielectric layer;
forming a first photoresist layer over the polysilicon layer;
patterning the first photoresist layer to form a first photoresist mask, the first photoresist mask comprising an open region and a protective region;
performing a first etch whereby etchant is applied to a target region of the polysilicon layer by way of the open region and is not applied to a second region of the polysilicon layer due to the protective region to form an etched polysilicon layer;
forming a second photoresist layer over the etched polysilicon layer;
patterning the second photoresist layer to form a second photoresist mask comprising a first photoresist mask portion for defining an overlay alignment mark and a second photoresist mask portion for defining a gate structure; and
performing a second etch using the second photoresist mask to form the overlay alignment mark and the gate structure within the etched polysilicon layer.

18. The method of claim 17, comprising:
forming a third photoresist layer over the etched polysilicon layer, the forming a second photoresist layer comprising:
forming the second photoresist layer over the third photoresist layer.

19. The method of claim 17, the performing a second etch comprising:
further etching the target region of the polysilicon layer.

20. The method of claim 19, the performing a second etch comprising:
etching the second region of the polysilicon layer.

* * * * *